United States Patent
Cha et al.

(10) Patent No.: US 9,437,624 B2
(45) Date of Patent: Sep. 6, 2016

(54) THIN FILM TRANSISTOR SUBSTRATE, DISPLAY APPARATUS COMPRISING THE SAME, METHOD OF MANUFACTURING THIN FILM TRANSISTOR SUBSTRATE, AND METHOD OF MANUFACTURING DISPLAY APPARATUS

(71) Applicant: SAMSUNG DISPLAY CO., LTD., Yongin, Gyeonggi-Do (KR)

(72) Inventors: Myounggeun Cha, Yongin (KR); Dongjo Kim, Yongin (KR); Yoonho Khang, Yongin (KR); Myounghwa Kim, Yongin (KR); Kyoungwon Lee, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 26 days.

(21) Appl. No.: 14/689,927

(22) Filed: Apr. 17, 2015

(65) Prior Publication Data

US 2016/0093646 A1 Mar. 31, 2016

(30) Foreign Application Priority Data

Sep. 29, 2014 (KR) .................. 10-2014-0130337

(51) Int. Cl.
*H01L 29/12* (2006.01)
*H01L 27/12* (2006.01)
(Continued)

(52) U.S. Cl.
CPC ....... *H01L 27/1255* (2013.01); *H01L 27/1274* (2013.01); *H01L 29/66757* (2013.01); *H01L 29/66765* (2013.01); *H01L 29/78675* (2013.01); *H01L 29/78678* (2013.01)

(58) Field of Classification Search
USPC .......................................... 257/71
See application file for complete search history.

(56) References Cited

U.S. PATENT DOCUMENTS

| 4,921,813 A | * | 5/1990 | Madan ............ H01L 21/76895 257/E21.59 |
| 5,112,765 A | * | 5/1992 | Cederbaum ....... H01L 21/76895 148/DIG. 164 |

(Continued)

FOREIGN PATENT DOCUMENTS

| KR | 10-2006-0118063 A | 11/2006 |
| KR | 10-2013-0005550 A | 1/2013 |

(Continued)

OTHER PUBLICATIONS

Akito Hara, et al., "Self-Aligned Metal Double-Gate Low-Temperature Polycrystalline Silicon Thin-Film Transistors on Glass Substrate Using Back-Surface Exposuer", Jpn. J. Appl. Phys. vol. 50 pp. 021401 (2011).

*Primary Examiner* — Anthony Ho
(74) *Attorney, Agent, or Firm* — Lee & Morse, P.C.

(57) ABSTRACT

A thin film transistor (TFT) substrate, a flat display apparatus including the TFT substrate, a method of manufacturing the TFT substrate, and a method of manufacturing the flat display apparatus, the thin film transistor (TFT) substrate including a substrate; a first gate electrode on the substrate, the first gate electrode including a first branch electrode and a second branch electrode that are spaced apart from one another; a polysilicon layer on the first gate electrode and insulated from the first gate electrode; and a second gate electrode on the polysilicon layer, the second gate electrode being insulated from the polysilicon layer and overlying the first and second branch electrodes.

17 Claims, 4 Drawing Sheets

(51) Int. Cl.
 *H01L 29/786* (2006.01)
 *H01L 29/66* (2006.01)

(56) References Cited

U.S. PATENT DOCUMENTS

| | | | | |
|---|---|---|---|---|
| 5,124,769 | A * | 6/1992 | Tanaka | H01L 29/7831 257/366 |
| 5,222,039 | A * | 6/1993 | Vinal | H01L 27/1104 257/403 |
| 5,396,099 | A * | 3/1995 | Kitajima | H01L 29/6675 257/347 |
| 5,600,154 | A * | 2/1997 | Shimizu | H01L 27/1108 257/66 |
| 6,080,236 | A * | 6/2000 | McCulloch | B24B 37/013 117/200 |
| 6,746,901 | B2 | 6/2004 | Kasahara et al. | |
| 6,999,350 | B2 * | 2/2006 | Matsubara | G06F 9/445 257/E21.683 |
| 8,835,235 | B2 * | 9/2014 | Nishida | H01L 29/6675 257/66 |
| 2003/0094611 | A1 * | 5/2003 | Hayakawa | H01L 21/2026 257/49 |
| 2013/0153914 | A1 | 6/2013 | You et al. | |
| 2013/0207117 | A1 | 8/2013 | An et al. | |
| 2014/0362644 | A1 * | 12/2014 | Lue | H01L 27/092 365/185.17 |

FOREIGN PATENT DOCUMENTS

| | | |
|---|---|---|
| KR | 10-2013-0019119 A | 2/2013 |
| KR | 10-2013-0069048 A | 6/2013 |
| KR | 10-2013-0092229 A | 8/2013 |

\* cited by examiner

THIN FILM TRANSISTOR SUBSTRATE, DISPLAY APPARATUS COMPRISING THE SAME, METHOD OF MANUFACTURING THIN FILM TRANSISTOR SUBSTRATE, AND METHOD OF MANUFACTURING DISPLAY APPARATUS

CROSS-REFERENCE TO RELATED APPLICATION

Korean Patent Application No. 10-2014-0130337, filed on Sep. 29, 2014, in the Korean Intellectual Property Office, and entitled: "Thin Film Transistor Substrate, Display Apparatus Comprising the Same, Method of Manufacturing Thin Film Transistor Substrate, and Method of Manufacturing Display Apparatus," is incorporated by reference herein in its entirety.

BACKGROUND

1. Field

Embodiments relate to a thin film transistor (TFT) substrate, a display apparatus including the TFT substrate, a method of manufacturing the TFT substrate, and a method of manufacturing the display apparatus.

2. Description of the Related Art

In general, a thin film transistor (TFT) substrate refers to a structure having at least one TFT or at least one capacitor formed on a substrate. A TFT included in the TFT substrate may include an active layer that includes a polysilicon layer. The polysilicon layer may be formed by crystallizing an amorphous silicon layer.

SUMMARY

Embodiments are directed to a thin film transistor (TFT) substrate, a display apparatus including the TFT substrate, a method of manufacturing the TFT substrate, and a method of manufacturing the display apparatus.

The embodiments may be realized by providing a thin film transistor (TFT) substrate including a substrate; a first gate electrode on the substrate, the first gate electrode including a first branch electrode and a second branch electrode that are spaced apart from one another; a polysilicon layer on the first gate electrode and insulated from the first gate electrode; and a second gate electrode on the polysilicon layer, the second gate electrode being insulated from the polysilicon layer and overlying the first and second branch electrodes.

The first gate electrode may further include a connector that connects the first and second branch electrodes.

The TFT substrate may have a structure such that electric signals applied to the first and second electrodes are identical.

The TFT substrate may further include a first capacitor electrode on a same layer as the first gate electrode, the first capacitor electrode including a same material as the first gate electrode; and a second capacitor electrode on a same layer as the second gate electrode, the second capacitor electrode including a same material as the second gate electrode.

The TFT substrate may further include a first gate insulating layer between the first gate electrode and the polysilicon layer; and a second gate insulating layer between the second gate electrode and the polysilicon layer, wherein each of the first and second gate insulating layers has a through hole such that the first and second gate electrodes are connected.

The polysilicon layer may include a first portion that is between the first and second branch electrodes, the polysilicon layer may include second portions that overlie the first and second branch electrodes, and a grain size of the first portion of the polysilicon layer may be larger than a grain size of the second portions of the polysilicon layer.

The polysilicon layer may further include third portions corresponding to a side surface of the first branch electrode and a side surface of the second branch electrode, and a grain size of the third portions of the polysilicon layer may be larger than the grain size of the second portions and smaller than the grain size of the first portion.

The TFT substrate may further include a source electrode and a drain electrode that contact the polysilicon layer.

The embodiments may be realized by providing a display apparatus including the TFT substrate according to an embodiment, and a pixel electrode electrically connected to any one of the source electrode and the drain electrode.

The embodiments may be realized by providing a method of manufacturing a thin film transistor (TFT) substrate, the method including forming a first gate electrode on a substrate such that the first gate electrode including a first branch electrode and a second branch electrode that are spaced apart from one another; forming a first gate insulating layer that covers the first gate electrode; forming an amorphous silicon layer on the first gate insulating layer; crystallizing the amorphous silicon layer to form a polysilicon layer; forming a second gate insulating layer that covers the polysilicon layer; and forming a second gate electrode on the second gate insulating layer such that the second gate electrode overlies the first and second branch electrodes.

forming the first gate electrode may include forming the first gate electrode including the first branch electrode and the second branch electrode that are spaced apart from one another, and a connector that connects the first and second branch electrodes.

The method may further include forming a first capacitor electrode on a same layer as the first and second branch electrodes and using a same material as the first and second branch electrodes, and forming a second capacitor electrode on a same layer as the second gate electrode and using a same material as the second gate electrode.

The method may further include forming a through hole in the first insulating layer and the second insulating layer, wherein forming the second gate electrode includes forming the second gate electrode such that the second gate electrode is connected to the first gate electrode via the through hole.

Crystallizing the amorphous silicon layer may include irradiating the amorphous silicon layer with a laser beam such that, after the irradiation, a temperature of a first portion of the amorphous silicon layer between the first and second branch electrodes decreases at a slower rate than temperatures of second portions of the amorphous silicon layer, the second portions of the amorphous silicon layer overlying the first and second branch electrodes.

Crystallizing the amorphous silicon layer may include decreasing temperatures of third portions of the amorphous silicon layer, which third portions respectively correspond to a side surface of the first branch electrode and a side surface of the second branch electrode, such that the temperatures of the third portions decrease at a slower rate than the temperatures of the second portions and decrease at a faster rate than the temperature of the first portion.

The method may further include forming a source electrode and a drain electrode that contact the polysilicon layer.

The embodiments may be realized by providing a method of manufacturing a display apparatus, the method including preparing the TFT substrate according to the method according to an embodiment; and forming a pixel electrode electrically connected to any one of the source and drain electrodes.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
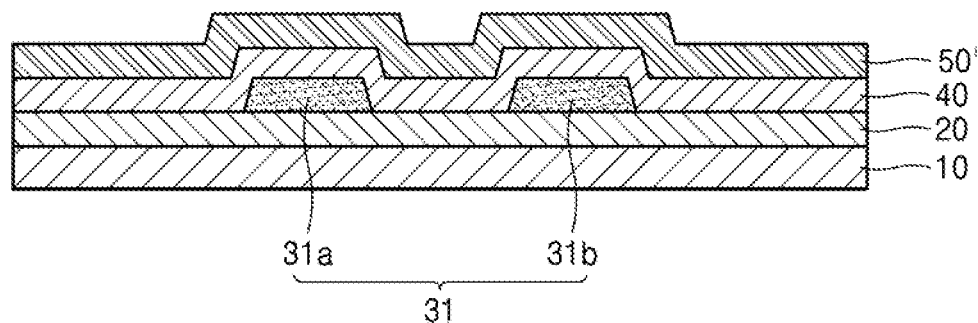
FIGS. 1 to 6 illustrate cross-sectional views of stages in a method of manufacturing a thin film transistor (TFT) substrate according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when a layer, region, or component is referred to as being "on" or "formed on" another layer, region, or component, it can be directly or indirectly formed on the other layer, region, or component. For example, intervening layers, regions, or components may be present.

FIGS. 1 to 6 illustrate cross-sectional views of stages in a method of manufacturing a thin film transistor (TFT) substrate according to an exemplary embodiment.

First, a first gate electrode 31, which includes a first branch electrode 31a and a second branch electrode 31b that are spaced apart from one another, may be formed on a substrate 10. The substrate 10 may include, e.g., glass, plastic, or metal. If desired, a buffer layer 20 (including, e.g., silicon oxide or silicon nitride) may be formed on the substrate 10. The first gate electrode 31 may be formed on the buffer layer 20, as shown in FIG. 1. The first branch electrode 31a and the second branch electrode 31b may be spaced apart from each other. In an implementation, the first gate electrode 31 may include a connector (not shown) that connects the first and second branch electrodes 31a and 31b. In this case, the first gate electrode 31 may be shaped in a form of "C."

After the first gate electrode 31 is formed, a first gate insulating layer 40 may be formed to cover the first gate electrode 31. The first gate insulating layer 40 may include various materials, e.g., an inorganic material, such as silicon oxide or silicon nitride, or an organic material, if the organic material has an insulating property.

Figure 2:
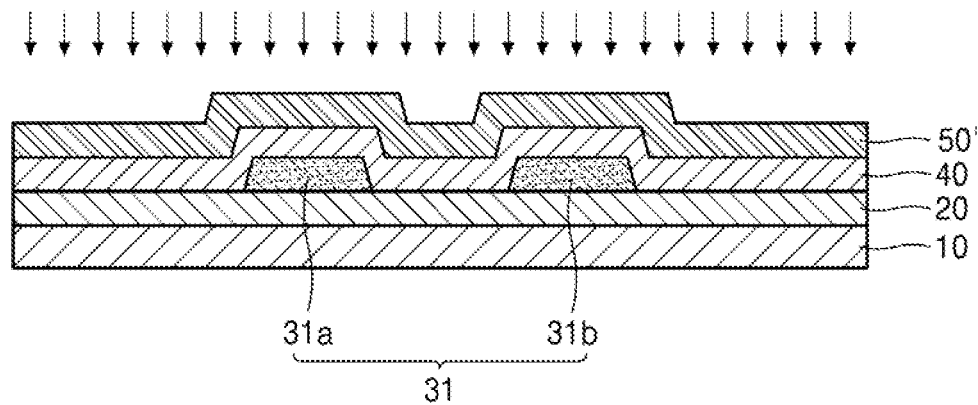

An amorphous silicon layer 50' may be formed on the first gate insulating layer 40 and crystallized so that the amorphous silicon layer 50' becomes a polysilicon layer, e.g., a crystalline polysilicon layer. Various methods may be used to perform the crystallization. For example, as shown in FIG. 2, the amorphous silicon layer 50' may be irradiated with an excimer laser beam and may thus be crystallized. When the amorphous silicon layer 50' is irradiated with the excimer laser beam, the amorphous silicon layer 50' may melt or nearly melt, and may then be crystallized as it cools down.

Figure 3:
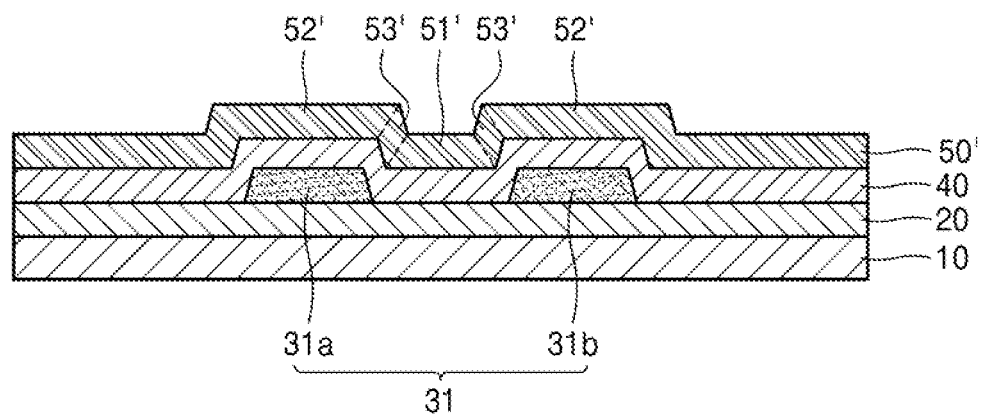

The first gate electrode 31 may be located under the amorphous silicon layer 50' as described above, and crystallization of the amorphous silicon layer 50' may be performed in a unique way. For example, as shown in FIG. 3, the amorphous silicon layer 50' may include a first portion 51' (that is an area between, e.g., laterally between, the first and second branch electrodes 31a and 31b), second portions 52' (that respectively correspond to or overlie the first and second branch electrodes 31a and 31b), and third portions 53' (that respectively correspond to a side surface of the first branch electrode 31a and a side surface of the second branch electrode 31b). The crystallization may be performed in or on the first to third portions 51' to 53'. For example, the third portions 53' may be parallel with the side surfaces (e.g., inner side surfaces) of the first branch electrode 31a and the second branch electrode 31b.

For example, after the amorphous silicon layer 50' is irradiated with the laser beam, a temperature of the first portion 51' may decrease at a slower rate than temperatures of the second portions 52'. This is because the second portions 52' may respectively correspond or overlie to the first and second branch electrodes 31a and 31b and thus function as a heat sink, e.g., a passage for the first and second branch electrodes 31a and 31b to emit heat. For example, the first and second branch electrodes 31a and 31b may conduct heat away from the second portions 52' more quickly than other parts during formation of the polysilicon layer 50. The temperature of the first portion 51' may decrease at a slower rate than the temperatures of the second portions 52', and the second portions 52' may be crystallized first, e.g., before the first portion 51' is crystallized. Therefore, a grain size may be greater in the first portion 51' than in the second portions 52'. For example, the first gate electrode 31 may include the first and second branch electrodes 31a and 31b, and a grain size of the first portion 51', which is the area of the amorphous silicon layer 50' between, e.g., laterally between, the first and second branch electrodes 31a and 31b, may be increased.

Temperatures of the third portions 53', which respectively correspond to the side surface of the first branch electrode 31a and the side surface of the second branch electrode 31b, may decrease at a slower rate than the temperatures of the second portions 52' but at a faster rate than the temperature of the first portion 51'. Therefore, a grain size of the third portions 53' may be greater than a grain size of the second portions 52' and may be smaller than the grain size of the first portion 51'.

Figure 4:
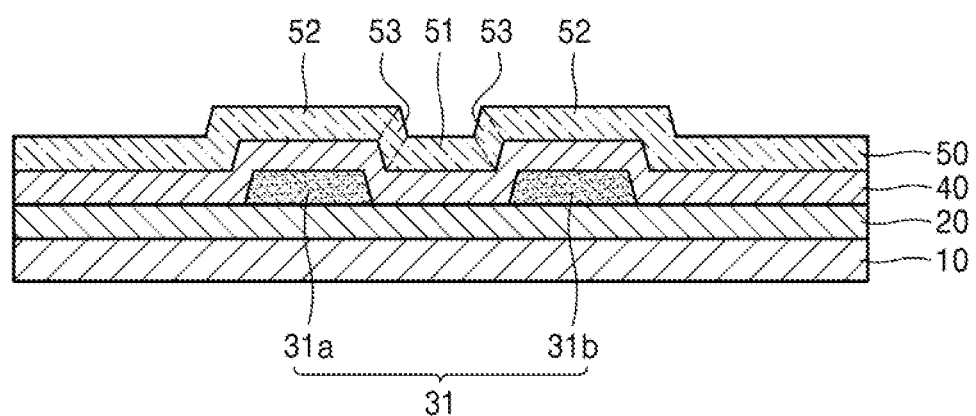

After the processes described above, a polysilicon layer 50 may be located on the first gate insulating layer 40, as shown in FIG. 4. In the polysilicon layer 50, a grain size of a first portion 51 (which is an area of the polysilicon layer 50 between the first and second branch electrodes 31a and 31b) may be larger than a grain size of second portions 52 (which respectively correspond to or overlie the first and second branch electrodes 31a and 31b). Also, a grain size of third portions 53, which respectively correspond to the side surface of the first branch electrode 31a and the side surface of the second branch electrode 31b, may be larger than the grain size of the second portions 52 and may be smaller than the grain size of the first portion 51.

Figure 5:
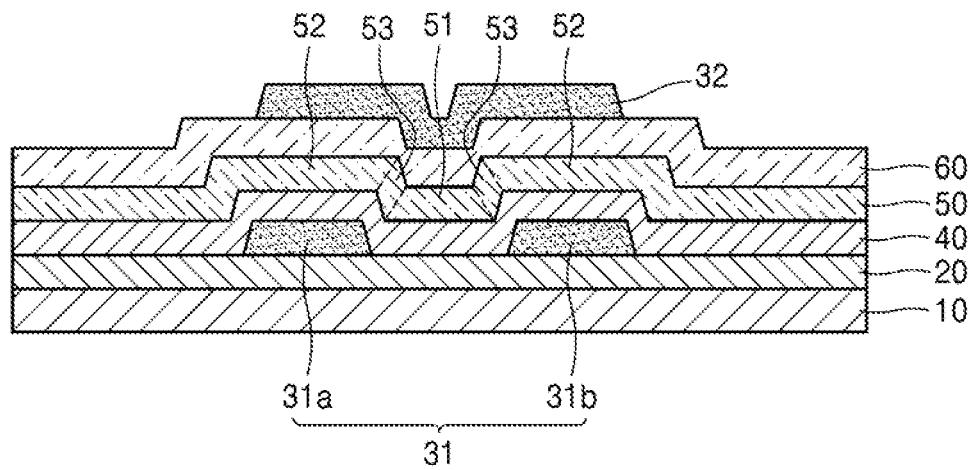
Figure 6:
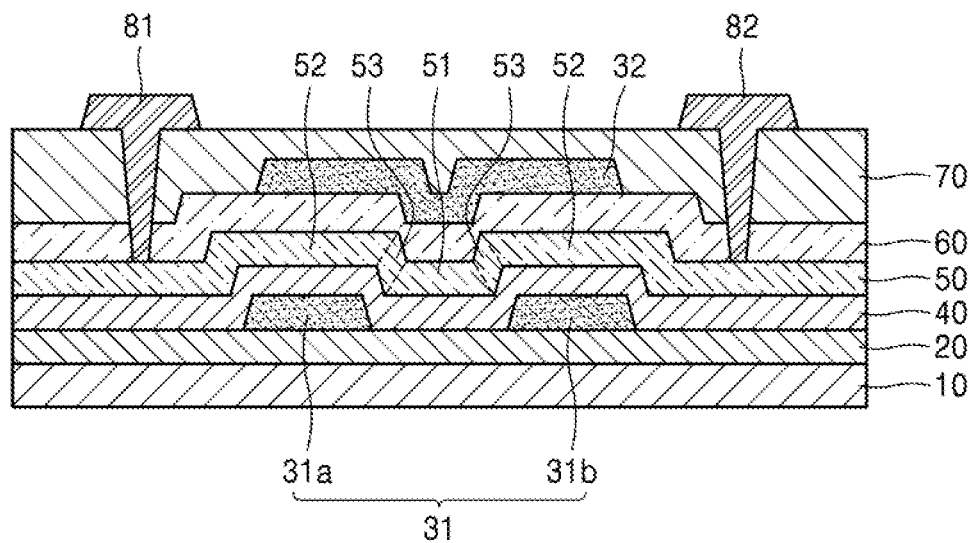

Then, as shown in FIG. 5, a second gate insulating layer 60 may be formed to cover the polysilicon layer 50. A second gate electrode 32 may be formed on the second gate insulating layer 60 and may correspond to or overlie the first and second branch electrodes 31a and 31b. Accordingly, a TFT may have a dual gate structure including the first gate electrode 31 and the second gate electrode 32. As shown in FIG. 6, an interlayer insulating layer 70 (that covers or overlies the second gate electrode 32) may be formed. A source electrode 81 and a drain electrode 82, which may contact the polysilicon layer 50 via a through hole that penetrates through the second gate insulating layer 60 and the interlayer insulating layer 70, may also be formed.

Based on a method of manufacturing the TFT substrate according to the present embodiment, the grain size of the first portion 51 (which is the area of the polysilicon layer 50 between the first and second branch electrodes 31a and 31b of the first gate electrode 31) may be increased. Accordingly, from among areas of the polysilicon layer 50 between the source and drain electrodes 81 and 82, an area that has a large grain size may be increased. As a result, the polysilicon layer 50 may have high mobility, and thus the performance of the TFT may be improved. Also, the TFT may have a dual gate structure, and off-current of the TFT may be reduced.

In an implementation, during the process of manufacturing the TFT substrate, when the first gate electrode 31 (which includes the first and second branch electrodes 31a and 31b that are spaced apart from each other) is formed, a first capacitor electrode (not shown) may be formed on a same layer as (e.g., coplanar with the first gate electrode 31 or on the buffer layer 20) the first gate electrode 31 by using a same material as the first gate electrode 31. Also, when the second gate electrode 32 is formed, a second capacitor electrode (not shown) may be formed on a same layer as (e.g., coplanar with the second gate electrode 32 or on the second gate insulating layer 60) the second gate electrode 32 by using a same material as the second gate electrode 32. Accordingly, it is possible to manufacture a TFT substrate that includes not only a TFT but also a capacitor.

Figure 7:
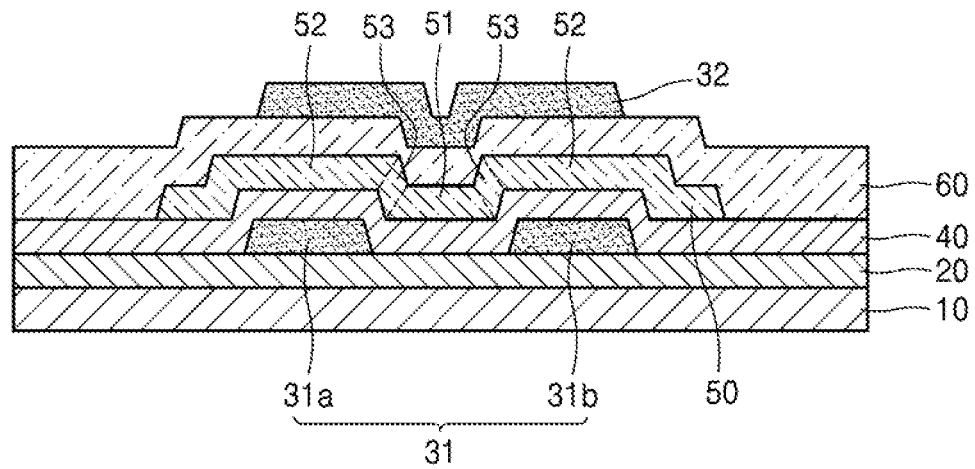
FIG. 7 illustrates a cross-sectional view of a TFT substrate according to an exemplary embodiment.

If the TFT has a dual gate structure as shown in FIG. 6, an identical electric signal may need to be applied to the first and second gate electrodes 31 and 32. To do so, after the second gate insulating layer 60 is formed, a through hole may be formed in the first and second gate insulating layers 40 and 60 before the second gate electrode 32 is formed. Then, the second gate electrode 32 may be formed such that the second gate electrode 32 is connected to the first gate electrode 31 via the through hole. The through hole may be formed so as not to penetrate through the polysilicon layer 50 such that the first gate electrode 31 or the second gate electrode 32 does not contact the polysilicon layer 50. This may be possible by using various methods, e.g. patterning the polysilicon layer 50 before the second gate insulating layer 60 is formed. For example, the polysilicon layer 50 may be patterned as shown in FIG. 7.

Figure 8:
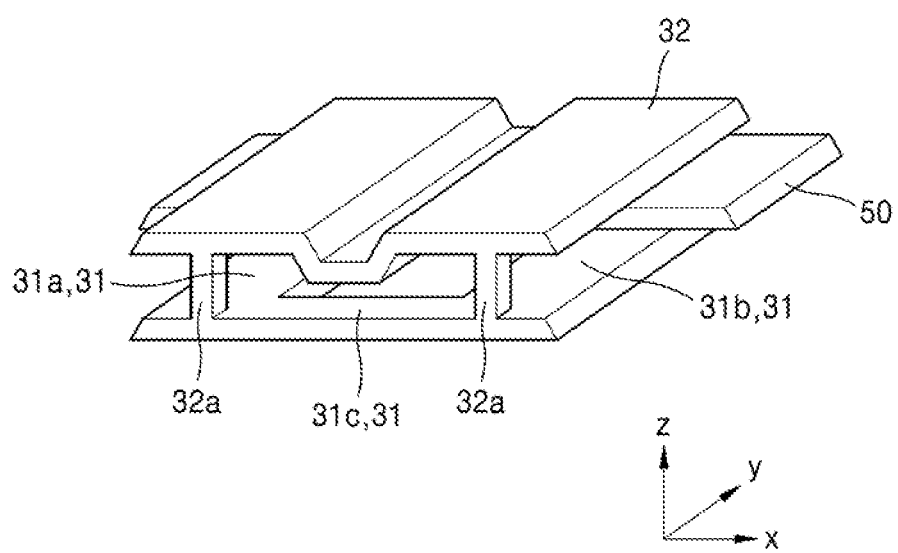
FIG. 8 illustrates parts of the TFT of FIG. 7.

FIG. 8 schematically shows the first gate electrode 31, the second gate electrode 32, and the polysilicon layer 50. FIG. 8 does not show the first and second gate insulating layers 40 and 60 for the sake of convenience. The first and second branch electrodes 31a and 31b that are spaced apart from each other are electrically connected by the connector 31c extending in +x direction between the first and second branch electrodes 31a and 31b. The first gate electrode 31 and the second gate electrode 32 may be electrically connected via the through hole. FIG. 8 shows the case where the second gate electrode 32 has protrusions 32a protruded from the second gate electrode 32 toward the first gate electrode 31 in −z direction so that the second gate electrode 32 is electrically connected to the first gate electrode 31.

In an implementation, the first and second gate electrodes 31 and 32 may not directly contact each other. For example, a first wiring (that applies electric signals to the first gate electrode 31 and a second wiring that applies electric signals to the second gate electrode 32) may be separately provided, and the first and second wirings may transmit identical electric signals. The first and second wirings may contact each other at anywhere on a substrate. For example, pads for applying electric signals may be provided at a periphery of the substrate, and the first and second wirings may contact each other at the pads.

Although the method of manufacturing the TFT substrate has been described above, an embodiment also provides a method of manufacturing a display apparatus including the TFT substrate. The display apparatus may be manufactured by preparing the TFT substrate using the above-described method, and then forming a pixel electrode that is electrically connected to any one of the source and drain electrodes 81 and 82. For example, an organic light-emitting display apparatus may be manufactured by forming a planarizing layer that covers the source and drain electrodes 81 and 82, a pixel electrode that contacts the drain electrode 82 via a through hole in the planarizing layer, an intermediate layer, which includes an emission layer, on the pixel electrode, and an opposite electrode on the intermediate layer.

In the display apparatus that is manufactured according to the method above, the polysilicon layer 50 of the TFT that controls an operation of each pixel may have high mobility, and off-current of the TFT may be reduced. Therefore, the operation of each pixel may be easily controlled, and it may be possible to display an image with accurate gray scale Although the method of manufacturing the TFT substrate and the method of manufacturing the display apparatus have been described above, the embodiments may also provide a TFT substrate and the display apparatus.

A TFT substrate according to an exemplary embodiment may have, e.g., the structure shown in FIG. 6. For example, the first gate electrode 31 located on the substrate 10 may include the first and second branch electrodes 31a and 31b that are spaced apart from each other. The polysilicon layer 50 may be disposed on and insulated from the first gate electrode 31. The second gate electrode 32 may be disposed on the polysilicon layer 50, insulated from the polysilicon layer 50, and may correspond to or overlie the first and second branch electrodes 31a and 31b. In an implementation, the first gate electrode 31 may additionally include a connector that connects the first and second branch electrodes 31a and 31b. In this case, the first gate electrode 31 may be shaped in the form of, e.g., "C."

With regard to the polysilicon layer 50 of the TFT according to the present embodiment, the grain size of the first portion 51 (which is the area of the polysilicon layer 50 between the first and second branch electrodes 31a and 31b) may be larger than the grain size of the second portions 52, which respectively correspond to or overlie the first and second branch electrodes 31a and 31b. Also, the grain size of the third portions 53, which respectively correspond to the side surface of the first branch electrode 31a and the side surface of the second branch electrode 31b, may be larger than the grain size of the second portions 52 and may be smaller than the grain size of the first portion 51. Accordingly, from among the areas of the polysilicon layer 50 between the source and drain electrodes 81 and 82, an area that has a large grain size may be increased. As a result, the polysilicon layer 50 may have high mobility, and thus the performance of the TFT may be improved. Also, the TFT may have a dual gate structure, and off-current of the TFT may be reduced.

In the above-described TFT, an identical electric signal may be applied to the first and second gate electrodes 31 and 32. To do so, a through hole may be formed in the first and second gate insulating layers 40 and 60, and the second gate electrode 32 may be connected to the first gate electrode 31 via the through hole. The through hole may be not penetrate through the polysilicon layer 50 so that the first gate electrode 31 or the second gate electrode 32 may not contact the polysilicon layer 50. To do so, the polysilicon layer 50 may be patterned using various methods, e.g., a pattern shown in FIG. 7.

In an implementation, the first and second gate electrodes 31 and 32 may not directly contact each other. In this case, a first wiring (that applies electric signals to the first gate electrode 31) and a second wiring (that applies electric signals to the second gate electrode 32) may be separately provided, and the first and second wirings may transmit identical electric signals. The first and second wirings may contact each other at anywhere on a substrate. For example, pads for applying electric signals may be provided on a periphery of the substrate, and the first and second wirings may contact each other at the pads.

A first capacitor electrode (not shown) may be disposed on a same layer as the first gate electrode 31 and may include a same material as the first gate electrode 31. A second capacitor electrode (not shown) may be disposed on a same layer as the second gate electrode 32 and may include a same material as the second gate electrode 32. Accordingly, a TFT substrate may not only include a TFT but may also include a capacitor without performing additional processes during the manufacturing process.

According to another exemplary embodiment, it is possible to manufacture a display apparatus that includes the above-described TFT substrate as well as a pixel electrode (not shown) that is electrically connected to any one of the source and drain electrodes 81 and 82. In such display apparatus, the polysilicon layer 50 of a TFT that controls an operation of each pixel may have high mobility, and off-current of the TFT may be reduced. Therefore, the operations of pixels may be easily controlled, and thus, it may be possible to display an image with accurate gray scale.

By way of summation and review, characteristics of a TFT may be determined according to a crystallization method or environment. For example, in some TFT substrates, a TFT formed on a substrate may not have excellent characteristics. Accordingly, a display device including such TFT substrate may display an image having uneven brightness even when an identical electric signal is applied to a plurality of pixels.

As described above, according to the one or more of the above exemplary embodiments, a TFT substrate having excellent features (such as high mobility), a flat display apparatus including the TFT substrate, a method of manufacturing the TFT substrate, and a method of manufacturing the flat display apparatus may be provided.

The embodiments may provide a TFT substrate having excellent features such as high mobility.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A thin film transistor (TFT) substrate, comprising:
a substrate;
a first gate electrode on the substrate, the first gate electrode including a first branch electrode and a second branch electrode that are spaced apart from one another;
a polysilicon layer on the first gate electrode and insulated from the first gate electrode; and
a second gate electrode on the polysilicon layer, the second gate electrode being insulated from the polysilicon layer and overlying the first and second branch electrodes,
wherein:
the polysilicon layer includes a first portion,
the polysilicon layer includes second portions that overlie the first and second branch electrodes, the first portion being between the second portions, and
a grain size of the first portion of the polysilicon layer is larger than a grain size of the second portions of the polysilicon layer.

2. The TFT substrate as claimed in claim 1, wherein the first gate electrode further includes a connector that connects the first and second branch electrodes.

3. The TFT substrate as claimed in claim 1, wherein the TFT substrate has a structure such that electric signals applied to the first and second electrodes are identical.

4. The TFT substrate as claimed in claim 1, further comprising:
a first capacitor electrode on a same layer as the first gate electrode, the first capacitor electrode including a same material as the first gate electrode; and
a second capacitor electrode on a same layer as the second gate electrode, the second capacitor electrode including a same material as the second gate electrode.

5. The TFT substrate as claimed in claim 1, further comprising:
a first gate insulating layer between the first gate electrode and the polysilicon layer; and
a second gate insulating layer between the second gate electrode and the polysilicon layer,
wherein each of the first and second gate insulating layers has a through hole such that the first and second gate electrodes are connected.

6. The TFT substrate as claimed in claim 1, wherein:
the polysilicon layer further includes third portions corresponding to a side surface of the first branch electrode and a side surface of the second branch electrode, and
a grain size of the third portions of the polysilicon layer are larger than the grain size of the second portions and smaller than the grain size of the first portion.

7. The TFT substrate as claimed in claim 1, further comprising a source electrode and a drain electrode that contact the polysilicon layer.

8. A display apparatus, comprising:
the TFT substrate as claimed in claim 7; and
a pixel electrode electrically connected to any one of the source electrode and the drain electrode.

9. A method of manufacturing a thin film transistor (TFT) substrate, the method comprising:

forming a first gate electrode on a substrate such that the first gate electrode including a first branch electrode and a second branch electrode that are spaced apart from one another;

forming a first gate insulating layer that covers the first gate electrode;

forming an amorphous silicon layer on the first gate insulating layer;

crystallizing the amorphous silicon layer to form a polysilicon layer;

forming a second gate insulating layer that covers the polysilicon layer; and forming a second gate electrode on the second gate insulating layer such that the second gate electrode overlies the first and second branch electrodes, wherein:

the polysilicon layer includes a first portion, the polysilicon layer includes second portions that overlie the first and second branch electrodes, the first portion being between the second portions, and a grain size of the first portion of the polysilicon layer is larger than a grain size of the second portions of the polysilicon layer.

10. The method as claimed in claim 9, wherein forming the first gate electrode includes forming:

the first gate electrode including the first branch electrode and the second branch electrode that are spaced apart from one another, and a connector that connects the first and second branch electrodes.

11. The method as claimed in claim 9, wherein:

the forming of the first gate electrode comprises forming a first capacitor electrode on a same layer as the first and second branch electrodes and using a same material as the first and second branch electrodes, and the forming of the second gate electrode comprises forming a second capacitor electrode on a same layer as the second gate electrode and using a same material as the second gate electrode.

12. The method as claimed in claim 9, further comprising forming a through hole in the first insulating layer and the second insulating layer, wherein forming the second gate electrode includes forming the second gate electrode such that the second gate electrode is connected to the first gate electrode via the through hole.

13. The method as claimed in claim 9, wherein crystallizing the amorphous silicon layer includes irradiating the amorphous silicon layer with a laser beam such that, after the irradiation, a temperature of a first portion of the amorphous silicon layer decreases at a slower rate than temperatures of second portions of the amorphous silicon layer, the second portions of the amorphous silicon layer overlying the first and second branch electrodes and the first portion being between the second portions.

14. The method as claimed in claim 13, wherein crystallizing the amorphous silicon layer includes decreasing temperatures of third portions of the amorphous silicon layer, which third portions respectively correspond to a side surface of the first branch electrode and a side surface of the second branch electrode, such that the temperatures of the third portions decrease at a slower rate than the temperatures of the second portions and decrease at a faster rate than the temperature of the first portion.

15. The method as claimed in claim 9, further comprising forming a source electrode and a drain electrode that contact the polysilicon layer.

16. A method of manufacturing a display apparatus, the method comprising:

preparing the TFT substrate according to the method as claimed in claim 15; and forming a pixel electrode electrically connected to any one of the source and drain electrodes.

17. A thin film transistor (TFT) substrate, comprising:

a substrate;

a first gate electrode on the substrate, the first gate electrode including a first branch electrode and a second branch electrode that are spaced apart from one another;

a polysilicon layer on the first gate electrode and insulated from the first gate electrode; and a second gate electrode on the polysilicon layer, the second gate electrode being insulated from the polysilicon layer and overlying the first and second branch electrodes, a first gate insulating layer between the first gate electrode and the polysilicon layer; and a second gate insulating layer between the second gate electrode and the polysilicon layer, wherein each of the first and second gate insulating layers has a through hole such that the first and second gate electrodes are connected.

* * * * *